(12) United States Patent
Suda et al.

(10) Patent No.: US 11,482,425 B2
(45) Date of Patent: Oct. 25, 2022

(54) ETCHING METHOD AND ETCHING APPARATUS

(71) Applicant: TOKYO ELECTRON LIMITED, Tokyo (JP)

(72) Inventors: Ryutaro Suda, Miyagi (JP); Maju Tomura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/131,016

(22) Filed: Dec. 22, 2020

(65) Prior Publication Data
US 2021/0202261 A1    Jul. 1, 2021

(30) Foreign Application Priority Data
Dec. 26, 2019  (JP) .............................. JP2019-237331

(51) Int. Cl.
*H01L 21/311*   (2006.01)
*H01L 21/67*    (2006.01)

(52) U.S. Cl.
CPC .. *H01L 21/31116* (2013.01); *H01L 21/31144* (2013.01); *H01L 21/67069* (2013.01)

(58) Field of Classification Search
None
See application file for complete search history.

(56) References Cited

U.S. PATENT DOCUMENTS

| | | | |
|---|---|---|---|
| 8,598,040 B2* | 12/2013 | Le Gouil | H01L 21/3065 438/714 |
| 2014/0308815 A1* | 10/2014 | Dokan | H01L 21/0206 438/714 |
| 2016/0042919 A1 | 2/2016 | Ishita et al. | |
| 2016/0351418 A1* | 12/2016 | Hsu | H01L 21/0206 |
| 2016/0379856 A1* | 12/2016 | Tomura | H01J 37/32724 438/711 |

FOREIGN PATENT DOCUMENTS

JP    2016-039310 A    3/2016

* cited by examiner

*Primary Examiner* — Roberts P Culbert
(74) *Attorney, Agent, or Firm* — Weihrouch IP

(57) ABSTRACT

An etching method includes: providing, on a stage, a substrate including an etching film containing a silicon oxide film, and a mask formed on the etching film; setting a temperature of the stage to be 0° C. or less; and generating plasma from a gas containing fluorine, nitrogen, and carbon, and having a ratio of the number of fluorine to the number of nitrogen (F/N) in a range of 0.5 to 10, thereby etching the silicon oxide film through the mask.

19 Claims, 7 Drawing Sheets

| | N2 | 0% | 5% | 10% | 25% | 50% |
|---|---|---|---|---|---|---|
| Ox | MASK ER | 358 | 284 | 326 | 338 | 362 |
| | OxER | 484 | 798 | 944 | 896 | 674 |
| | SELECTION RATIO | 1.35 | 2.81 | 2.90 | 2.65 | 1.86 |
| Nit | MASK ER | 294 | 296 | 316 | 312 | 310 |
| | NitER | 1480 | 1778 | 1810 | 1670 | 1254 |
| | SELECTION RATIO | 5.03 | 6.01 | 5.73 | 5.35 | 4.05 |

ETCHING METHOD AND ETCHING APPARATUS

CROSS-REFERENCE TO RELATED APPLICATIONS

This application is based on and claims priority from Japanese Patent Application No. 2019-237331 filed on Dec. 26, 2019 with the Japan Patent Office, the disclosure of which is incorporated herein in its entirety by reference.

TECHNICAL FIELD

The present disclosure relates to an etching method and an etching apparatus.

BACKGROUND

There is a technology for forming a deep hole in a silicon oxide film formed on a workpiece, or in a multilayer film in which a silicon oxide film and a silicon nitride film are alternately laminated on a workpiece. See, for example, Japanese Patent Laid-Open Publication No. 2016-039310.

SUMMARY

An etching method according to an aspect of the present disclosure includes a step of providing, a step of setting, and a step of etching. In the step of providing, a substrate including an etching film including a silicon oxide film, and a mask formed on the etching film is provided on a stage. In the step of setting, a temperature of the stage is set to be 0° C. or less. In the step of etching, the silicon oxide film is etched through the mask by generating plasma from a gas containing fluorine, nitrogen, and carbon, and having a ratio of the number of fluorine to the number of nitrogen (F/N) in a range of 0.5 to 10.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of the etching method and the etching apparatus disclosed herein will be described in detail with reference to the drawings. Further, the disclosed technology is not limited to the embodiments.

There is a technology referred to as a high aspect ratio contact (HARC) process for forming a hole with a high aspect ratio in a silicon oxide film formed on a substrate or a multilayer film in which silicon oxide films and silicon nitride films are alternately laminated. Nitrogen trifluoride ($NF_3$) is used in the HARC process. However, $NF_3$ has high reactivity with mask materials, for example, spin on carbon (SOC) or an amorphous carbon layer (ACL), and thus, a CD may expand. Therefore, it is expected to improve an etching rate while suppressing the expansion of the CD.

[Configuration of Plasma Processing System 1]

Figure 1:
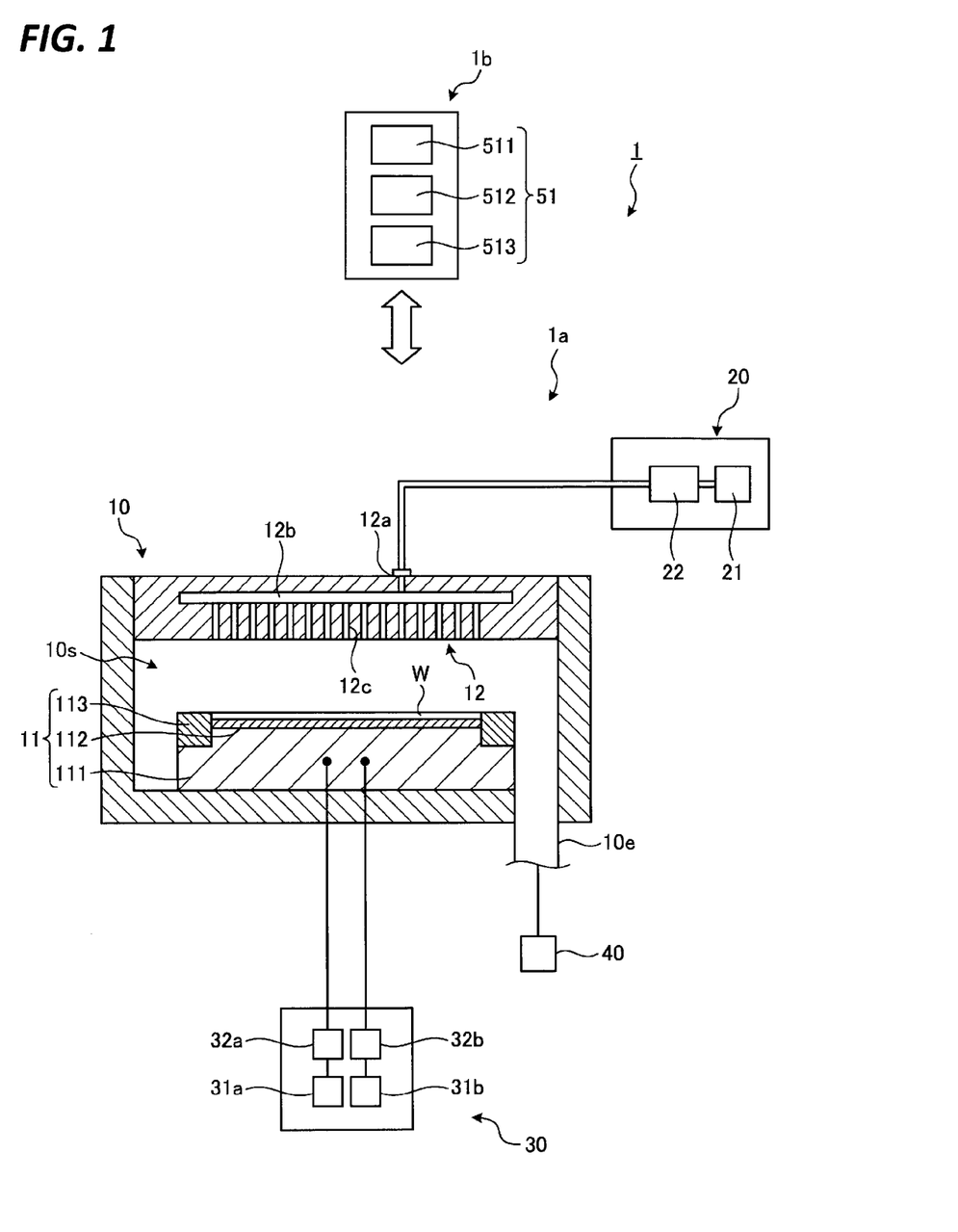
FIG. 1 is a view illustrating an example of a plasma processing system according to an embodiment of the present disclosure.

FIG. 1 is a view illustrating an example of a plasma processing system according to an embodiment of the present disclosure. As illustrated in FIG. 1, according to the embodiment, the plasma processing system 1 includes a plasma processing apparatus 1a and a controller 1b. The plasma processing apparatus 1a is an example of an etching apparatus that etches a silicon oxide film. The plasma processing apparatus 1a includes a reaction chamber 10, a gas supply 20, a radio frequency (RF) power supply 30, and an exhaust system 40. Further, the plasma processing apparatus 1a includes a support 11 and an upper electrode shower head 12. The support 11 is disposed in the lower area of a plasma processing space 10s in the reaction chamber 10. The upper electrode shower head 12 is disposed above the support 11 and may function as a part of a ceiling of the reaction chamber 10.

The support 11 is configured to support a substrate W in the plasma processing space 10s. The support 11 is also referred to as a stage. In the embodiment, the support 11 includes a lower electrode 111, an electrostatic chuck 112, and an edge ring 113. The electrostatic chuck 112 is disposed on the lower electrode 111, and is configured to support the substrate W on the upper surface of the electrostatic chuck 112. The edge ring 113 is disposed on the upper surface of the peripheral edge portion of the lower electrode 111 to surround the substrate W. Further, although not illustrated, according to the embodiment, the support 11 may include a temperature adjusting module configured to adjust at least one of the electrostatic chuck 112 and the substrate W to a target temperature. The temperature adjusting module may include a heater, a flow path, or a combination thereof. A temperature adjusting fluid such as a coolant or a heat transfer gas flows through the flow path. The temperature adjusting module may set, for example, the substrate W to any temperature in a range of 50° C. to 100° C. as the target temperature.

The upper electrode shower head 12 is configured to supply one or more processing gases from the gas supply 20 to the plasma processing space 10s. In the embodiment, the upper electrode shower head 12 includes a gas inlet 12a, a gas diffusion chamber 12b, and a plurality of gas outlets 12c. The gas inlet 12a is fluidically communicated with the gas supply 20 and the gas diffusion chamber 12b. The plurality of gas outlets 12c are fluidically communicated with the gas diffusion chamber 12b and the plasma processing space 10s. In the embodiment, the upper electrode shower head 12 is configured to supply one or more processing gases from the gas inlet 12a to the plasma processing space 10s via the gas diffusion chamber 12b and the plurality of gas outlets 12c.

The gas supply 20 may include one or more gas sources 21 and one or more flow rate controllers 22. In the embodiment, the gas supply 20 is configured to supply one or more processing gases from the respectively corresponding gas sources 21 to the gas inlets 12a via the respectively corresponding flow rate controllers 22. Each flow rate controller 22 may include, for example, a mass flow controller or a pressure-control type flow rate controller. Further, the gas supply 20 may include one or more flow rate modulation devices that modulate or pulse the flow rate of one or more processing gases.

The RF power supply 30 is configured to supply RF power, for example, one or more RF signals to one or more electrodes such as the lower electrode 111, the upper electrode shower head 12, or both the lower electrode 111 and the upper electrode shower head 12. Therefore, plasma is generated from one or more processing gases supplied to the plasma processing space 10s. Therefore, the RF power supply 30 may function as at least a part of a plasma generating unit configured to generate plasma from one or more processing gases in the reaction chamber. In the embodiment, the RF power supply 30 includes two RF generating units 31a and 31b and two matching circuits 32a and 32b. In the embodiment, the RF power supply 30 is configured to supply a first RF signal from the first RF generating unit 31a to the lower electrode 111 via the first matching circuit 32a. For example, the first RF signal may have a frequency in a range of 27 MHz to 100 MHz.

Further, in the embodiment, the RF power supply 30 is configured to supply a second RF signal from the second RF generating unit 31b to the lower electrode 111 via the second matching circuit 32b. For example, the second RF signal may have a frequency in a range of 400 kHz to 13.56 MHz. Alternatively, a direct current (DC) pulse generating unit may be used instead of the second RF generating unit 31b.

Further, although not illustrated, other embodiments may be considered in the present disclosure. For example, in an alternative embodiment, the RF power supply 30 may be configured to supply a first RF signal from a RF generating unit to the lower electrode 111, to supply a second RF signal from another RF generating unit to the lower electrode 111, and to supply a third RF signal from yet another RF generating unit to the lower electrode 111. Additionally, in another alternative embodiment, a DC voltage may be applied to the upper electrode shower head 12.

Further, in various embodiments, the amplitude of one or more RF signals (i.e., the first RF signal, the second RF signal, and the like) may be pulsed or modulated. The amplitude modulation may include pulsing the RF signal amplitude between ON state and OFF state, or between two or more different ON states.

The exhaust system 40 may be connected to an exhaust port 10e provided in, for example, a bottom portion of the reaction chamber 10. The exhaust system 40 may include a pressure valve and a vacuum pump. The vacuum pump may include a turbo molecular pump, a roughing pump, or a combination thereof.

In the embodiment, the controller 1b processes computer-executable instructions that cause the plasma processing apparatus 1a to execute the various steps described in the present disclosure. The controller 1b may be configured to control each element of the plasma processing apparatus 1a so as to execute the various steps described here. In the embodiment, a part of or the entire controller 1b may be included in the plasma processing apparatus 1a. The controller 1b may include, for example, a computer 51. The computer 51 may include, for example, a processing unit (central processing unit; CPU) 511, a storage unit 512, and a communication interface 513. The processing unit 511 may be configured to perform various control operations based on a program stored in the storage unit 512. The storage unit 512 may include a random access memory (RAM), a read only memory (ROM), a hard disk drive (HDD), a solid stage drive (SDD), or a combination thereof. The communication interface 513 may communicate with the plasma processing apparatus 1a via a communication line such as a local area network (LAN).

[Configuration of Substrate W]

Figure 2:
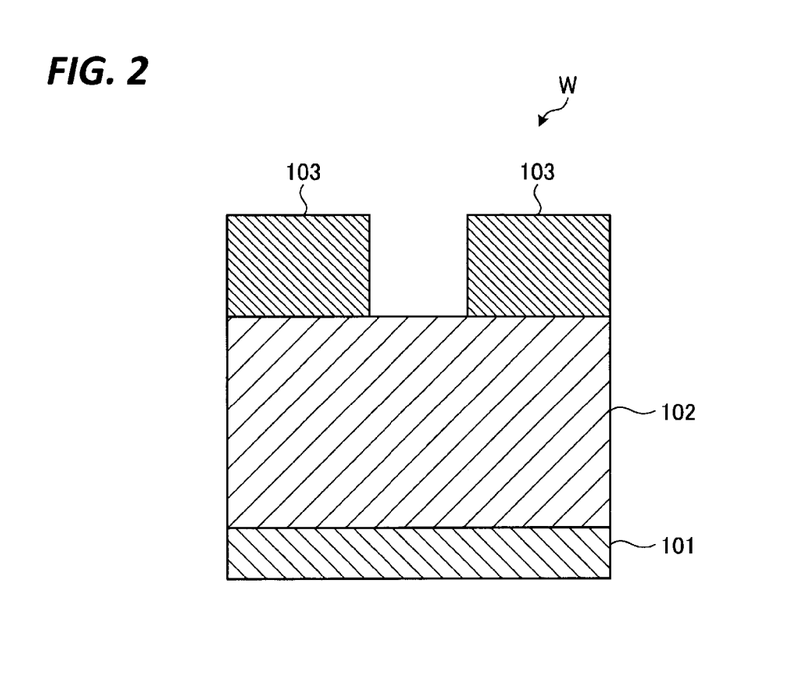
FIG. 2 is a view illustrating an example of a structure of a substrate etched by an etching apparatus according to the embodiment.

FIG. 2 is a view illustrating an example of a structure of a substrate etched by an etching apparatus according to the embodiment.

For example, as illustrated in FIG. 2, the substrate W includes a silicon oxide film 102 serving as an etching film on a silicon substrate 101. Further, a mask 103 having an opening with a predetermined pattern is formed on the silicon oxide film 102. The etching film may be a multilayer film in which silicon oxide films and silicon nitride films are alternately laminated. Further, the etching film may include a silicon (Si) film other than the silicon oxide film. Further, the etching film may include a Low-k film other than the silicon oxide film. The Low-k film may be a SiOCN-based film.

The mask 103 may be an organic mask or a mask containing a metal. The organic mask is, for example, a photoresist, a spin on carbon (SOC) film, or an amorphous carbon (ACL) film. The mask containing a metal includes, for example, tungsten, tungsten carbide, titanium dioxide, or titanium oxide. When a gas that does not contain carbon is used as a processing gas, the mask 103 uses a carbon-containing mask made of a carbon-containing material.

[Etching Method]

Figure 3:
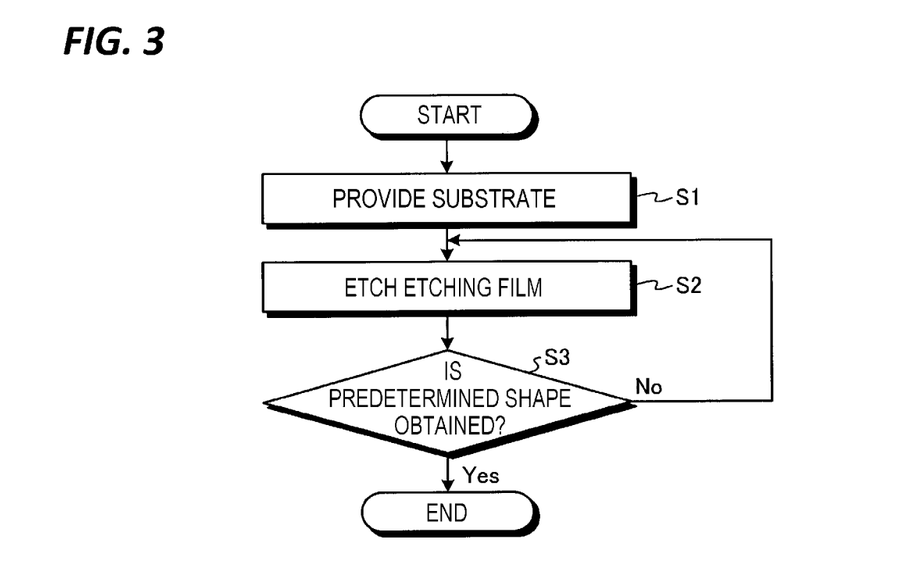
FIG. 3 is a flowchart illustrating an example of an etching processing according to the embodiment.

Next, an etching method according to the embodiment will be described. FIG. 3 is a flowchart illustrating an example of an etching processing according to the embodiment.

In the etching method according to the embodiment, the controller 1b opens an opening (not illustrated), and the substrate W including the silicon oxide film 102 and the mask 103 on the silicon oxide film 102 is carried into the reaction chamber 10, and placed on the electrostatic chuck 112 of the support 11. The substrate W is held by the electrostatic chuck 112 by applying a DC voltage to the electrostatic chuck 112. After that, the controller 1b closes the opening and controls the exhaust system 40 to exhaust the gas from the plasma processing space 10s so that the atmosphere of the plasma processing space 10s becomes a predetermined vacuum degree. Further, the controller 1b controls a temperature adjusting module (not illustrated) to adjust the temperature of the substrate W to a predetermined temperature, for example, 0° C. or less (step S1). The temperature of the substrate W may be adjusted to −30° C. or less.

Next, the controller 1b supplies a mixed gas of HF gas and $N_2$ gas (hereinafter, referred to as a $HF/N_2$ gas) to the gas inlet 12a. The processing gas is supplied to the gas inlet 12a, and then, is supplied to the gas diffusion chamber 12b and diffused. The processing gas is diffused from the gas diffusion chamber 12b, and then, is supplied in a shower-type to the plasma processing space 10s of the reaction chamber 10 via the plurality of gas outlets 12c, and introduced into the plasma processing space 10s.

The controller 1b controls the RF power supply 30 to supply a plasma excitation RF signal and a bias RF signal to the support 11. Plasma is generated in the plasma processing space 10s by supplying the plasma excitation RF signal to the support 11. The plasma is accelerated toward the substrate W by supplying the bias RF signal to the support 11. In the substrate W, the silicon oxide film 102 serving as an etching film is etched by the plasma generated in the plasma processing space 10s (step S2).

Specifically, in the plasma processing space 10s into which $HF/N_2$ gas serving as a processing gas is introduced, the controller 1b etches the silicon oxide film 102 by the plasma generated from $HF/N_2$ gas through the mask 103. The silicon oxide film 102 is etched such that an aspect ratio of a hole formed in the silicon oxide film 102 during the etching step becomes a predetermined value (e.g., 5 or more).

Here, the plasma generated in the plasma processing space 10s is plasma having hydrogen, fluorine and nitrogen derived from $HF/N_2$ gas and carbon derived from the mask 103 as reactive species. The ratio of the number of fluorine to the number of nitrogen contained in the plasma (F/N) may be set as a flow rate ratio of HF gas and $N_2$ gas. For example, in a case of $HF/N_2$ gas, $N_2$ gas is set in a range of 5% to 50% with respect to the total flow rate, that is, the ratio (F/N) is set in a range of 0.5 to 10. Further, the ratio (F/N) may be set in a range of 1.5 to 10. The ratio (F/N) may further be set to approximately 4.5. In the case of $HF/N_2$ gas, this corresponds to a flow rate ratio of $N_2$ gas in a range of 5% to 25%, more desirably approximately 10%. When another gas is used as the processing gas, the flow rate ratio of the processing gas is adjusted based on the ratio (F/N). For example, a mixed gas of $H_2$, $CF_4$, and $N_2$ (hereinafter, referred to as $H_2/CF_4/N_2$ gas) may be used as another processing gas.

Figure 4:
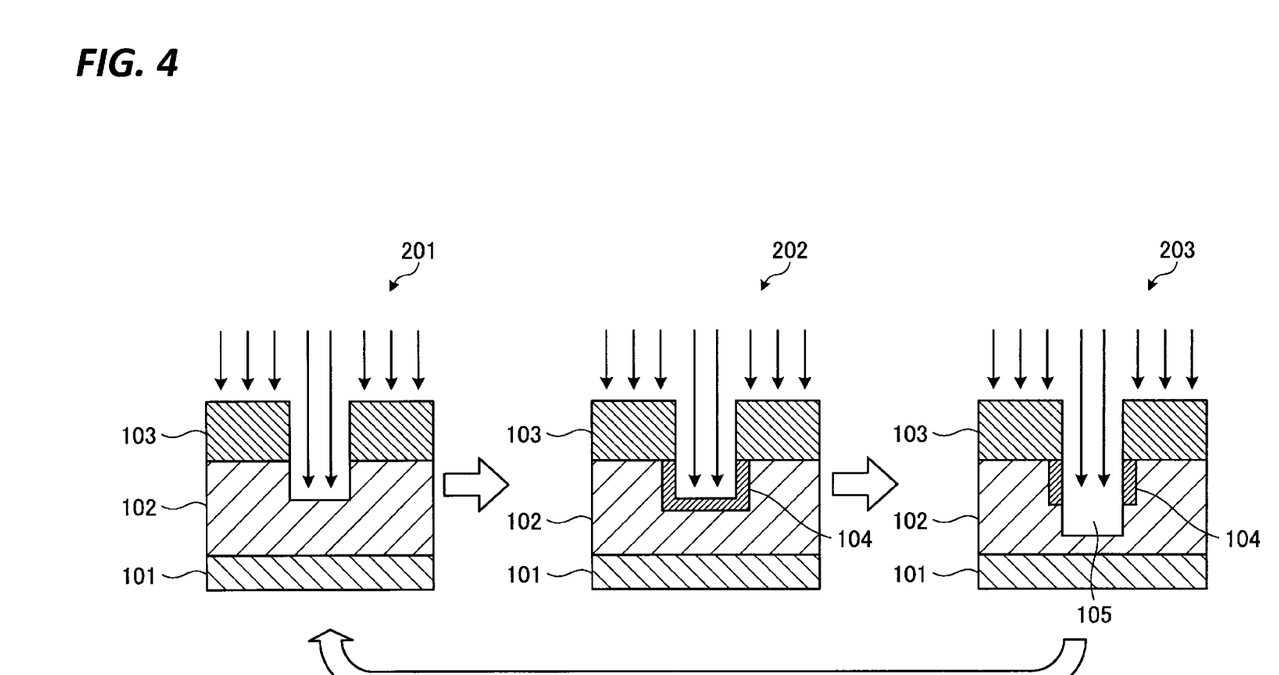
FIG. 4 is a view for schematically explaining an example of an etching mechanism according to the embodiment.

Here, an etching mechanism with an N-based gas will be described with reference to FIG. 4. FIG. 4 is a view for schematically explaining an example of an etching mechanism according to the embodiment. In a state 201 in FIG. 4, the hole in the silicon oxide film 102 is irradiated with plasma of $HF/N_2$ gas or $H_2/CF_4/N_2$ gas. That is, a cyanide-containing gas (CN-based gas) may be contained in the plasma as reactive species. As a result, as illustrated in a state 202, CN-based radicals are adsorbed on an area 104 inside the hole (etched portion). Although the CN-based gas has a high vapor pressure, the CN-based radicals may be adsorbed on the area 104 by lowering the temperature of the substrate W. The cyanide (CN group) may include, for example, HCN, CNF, and $C_2N_2$.

When the CN-based radicals are adsorbed on the area 104, as illustrated in a state 203, the area 104 where $N_2^+$ ions collide and an area 105 which is the silicon oxide film 102 below the area 104 are removed. That is, Si dangling bond generated by the ion impact and the CN are terminated, and the bonding of $SiO_2$ is broken. Thus, the etching rate increases. Further, since $N_2$ has a strong bonding and is difficult to dissociate, it is possible to suppress isotropic etching by N radicals. That is, it is possible to improve the etching rate while suppressing the expansion of the CD by repeating the state 201 to state 203. As described above, in the embodiment, the CN compound produced by adding $N_2$ also contributes to the improvement of the etching rate.

The description will refer back to FIG. 3. The controller 1b determines whether a predetermined shape is obtained in the etching step (step S3). When it is determined that the predetermined shape is not obtained (No in step S3), the controller 1b returns the processing to step S2. Meanwhile, when it is determined that the predetermined shape is obtained (Yes in step S3), the controller 1b ends the processing.

When the processing is ended, the controller 1b controls the RF power supply 30 to stop the supply of the RF signals to the support 11. The controller 1b opens the opening (not illustrated). The substrate W is carried out from the plasma processing space 10s of the reaction chamber 10 through the opening.

[Experimental Result]

Figure 5:
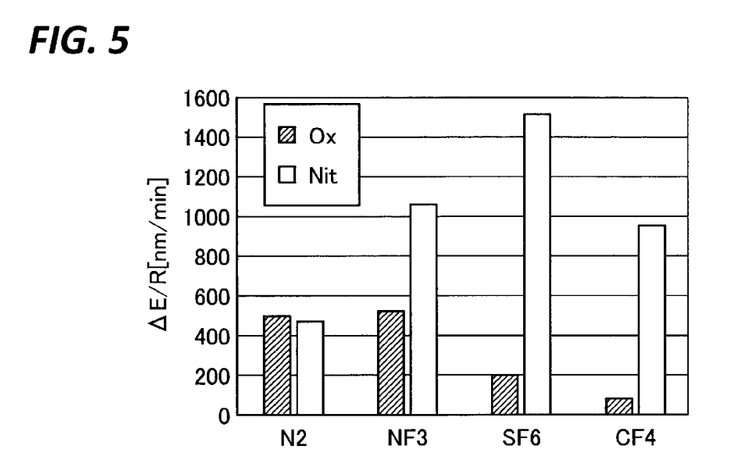
FIG. 5 is a graph illustrating changes in an etching rate in experimental results.
Figure 6:
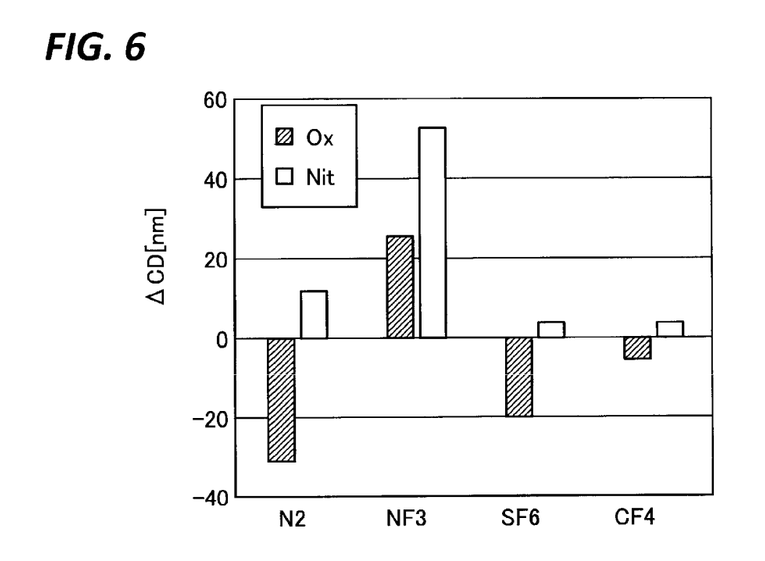
FIG. 6 is a graph illustrating changes in a critical dimension (CD) in experimental results.

Subsequently, experimental results will be described with reference to FIGS. 5 to 9. In the following description, the temperature represents a temperature at the time of starting of the plasma processing (etching) of the substrate W. First, a comparison of etching rates when various gases are added will be described with reference to FIGS. 5 and 6. In each experimental result when various gases are added, the total flow rate is set to 500 sccm, and 50 sccm of various gases X is added to 450 sccm of HF gas, and then, etching is performed with respect to the silicon oxide film and the silicon nitride film under the following processing conditions. In FIGS. 5 and 6, the silicon oxide film is indicated by Ox, and the silicon nitride film is indicated by Nit. Here, the various gases X are any one of $N_2$ gas, $NF_3$ gas, $SF_6$ gas, and $CF_4$ gas. When the various gases X are not added, the flow rate of HF gas is set to 500 sccm. Further, in the processing conditions, "CW" in the power of the RF signal represents a continuous wave.

[Processing Conditions]
(Etching)
Pressure in the reaction chamber 10: 25 mTorr (3.333 Pa)
Power of the first RF signal (40 MHz): 4.4 kW (CW)
Power of the second RF signal (400 kHz): 7.0 kW (CW)
Processing time: 30 seconds
Temperature: −70° C.
Processing gas: HF/Various gases X=450/50 sccm FIG. 5 is a graph illustrating changes in an etching rate in experimental results. FIG. 6 is a graph illustrating changes in a CD in experimental results. In FIGS. 5 and 6, the increase/decrease is illustrated based on the case of HF gas. Further, the unit of the difference (ΔE/R) in the etching rate in FIG. 5 is [nm/min], and the unit of ΔCD in FIG. 6 is [nm]. As illustrated in FIGS. 5 and 6, in an N-based gas ($N_2$ gas and $NF_3$ gas), it may be seen that the difference (increased amount) in the etching rate of the silicon oxide film is "508" for $N_2$ gas, and "530" for $NF_3$ gas, and the etching rate is increased significantly. Meanwhile, in $SF_6$ gas and $CF_4$ gas, it may be seen that the difference (increased amount) in the etching rate of the silicon oxide film is "214" for $SF_6$ gas, and "86" for $CF_4$ gas, and the difference is small. In the silicon nitride film, the etching rate increases for all the gases of $N_2$ gas, $NF_3$ gas, $SF_6$ gas, and $CF_4$ gas. Further, as illustrated in FIG. 6, with respect to the CD, it may be seen that $NF_3$ is significantly worse than that of other gases. As described above, in $HF/N_2$ gas, it is possible to improve the etching rate of the silicon oxide film while suppressing the expansion of the CD.

Figure 7:
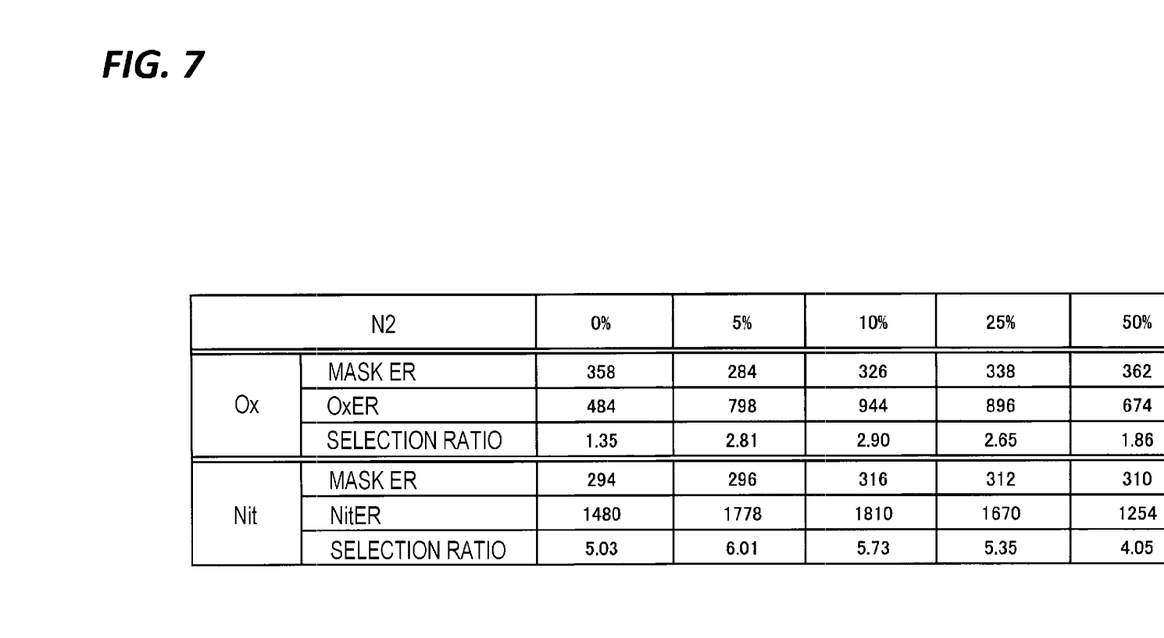
FIG. 7 is a view illustrating an example of experimental results when a flow rate ratio of HF gas/$N_2$ gas is changed.
Figure 8:
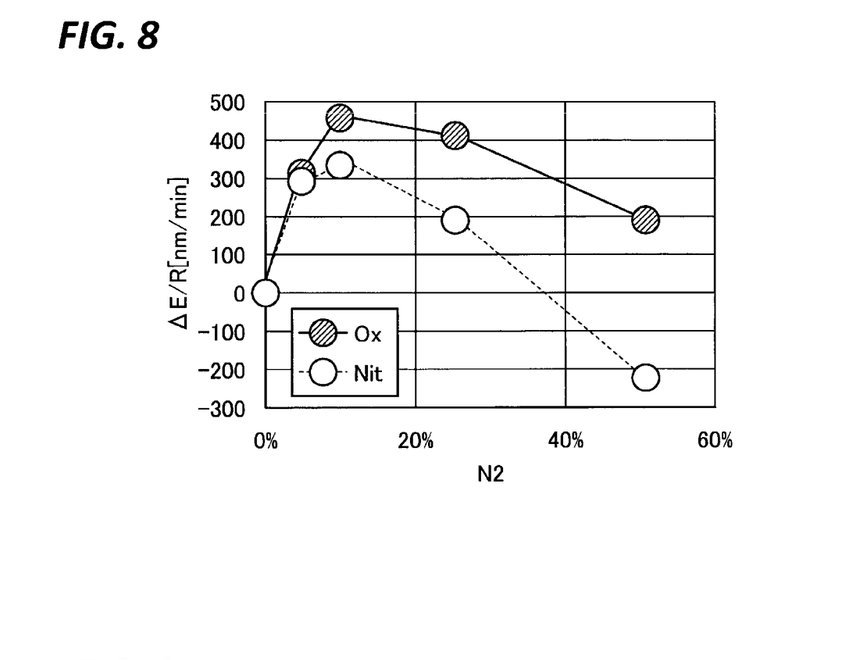
FIG. 8 is a graph illustrating changes in an etching rate in the experimental results in FIG. 7.
Figure 9:
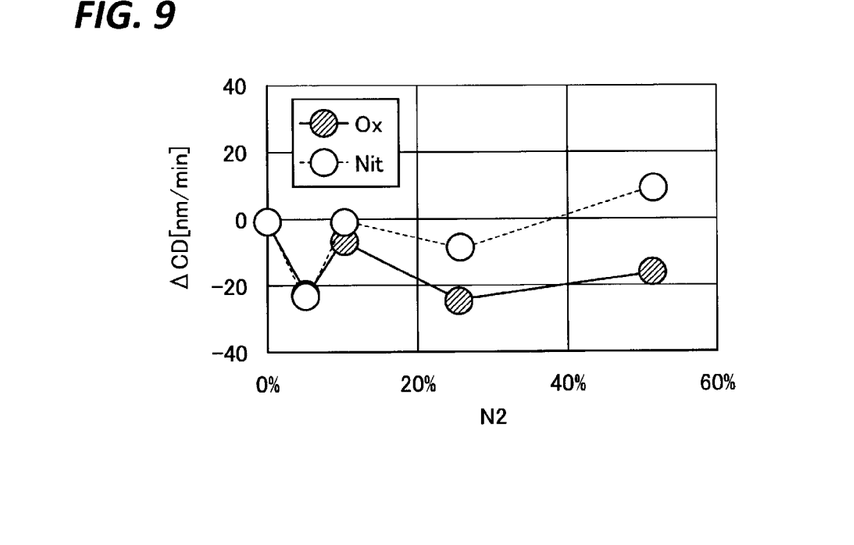
FIG. 9 is a graph illustrating changes in a CD in the experimental results in FIG. 7.

Next, a comparison of etching rates when the flow rate ratio of $HF/N_2$ gas is changed will be described with reference to FIGS. 7 to 9. FIG. 7 is a view illustrating an example of experimental results when the flow rate ratio of HF/N$_2$ gas is changed. In each experimental result in FIG. 7, the total flow rate is set to 200 sccm, and the flow rate ratio of N$_2$ gas is set to 0%, 5%, 10%, 25%, and 50%, and then, etching is performed with respect to the silicon oxide film and the silicon nitride film under the following processing conditions. Further, in the processing conditions, "CW" in the power of the RF signal represents a continuous wave. In FIGS. 7 to 9, the silicon oxide film is indicated by Ox, and the silicon nitride film is indicated by Nit. Further, in FIG. 7, a mask etching rate (mask ER), a silicon oxide film etching rate (OxER), a silicon nitride film etching rate (NitER), and a selection ratio are illustrated for each flow rate ratio. The unit of the etching rate is [nm/min].

[Processing Conditions]
(Etching)
Pressure in the reaction chamber 10: 25 mTorr (3.333 Pa)
Power of the first RF signal (40 MHz): 4.4 kW (CW)
Power of the second RF signal (400 kHz): 7.0 kW (CW)
Processing time: 30 seconds
Temperature: −70° C.
Flow rate of the processing gas (HF/N$_2$): 200/0 sccm (0%)
: 190/10 sccm (5%)
: 180/20 sccm (10%)
: 150/50 sccm (25%)
: 100/100 sccm (50%)

FIG. 8 is a graph illustrating changes in an etching rate in the experimental results in FIG. 7. FIG. 9 is a graph illustrating changes in a CD in the experimental results in FIG. 7. In FIGS. 8 and 9, the increase/decrease is illustrated based on the case where the flow rate ratio of N$_2$ gas is 0%. Further, the unit of the difference (ΔE/R) in the etching rate in FIG. 8 is [nm/min], and the unit of the difference (ΔCD) in the CD in FIG. 9 is [nm/min]. As illustrated in FIGS. 7 to 9, it may be seen that, with respect to the silicon oxide film, when the flow rate ratio of N$_2$ gas is 10%, the difference of the etching rate is "460," and the etching rate becomes the maximum. Meanwhile, with respect to the silicon nitride film, it may be seen that, as in the case of the silicon oxide film, when the flow rate ratio of N$_2$ gas is 10%, the difference of the etching rate is "330," and the difference becomes the maximum, but when the flow rate ratio of N$_2$ gas is 50%, the difference of the etching rate is "−226," and the etching rate is lowered than the case where the flow rate ratio of N$_2$ gas is 0%. Further, as illustrated in FIG. 9, it may be seen that, in the silicon oxide film, the CD does not expand when the flow rate ratio of N$_2$ gas is 5% to 50%. Further, it may be seen that, in the silicon nitride film, the CD does not expand when the flow rate ratio of N$_2$ gas is 5% to 25%, and slightly expands when the flow rate ratio of N$_2$ gas is 50%. That is, it may be seen that the change in the flow rate ratio of N$_2$ gas has an effect only on the etching rate.

Subsequently, dependence of the etching rate on the power (LF power) of the second RF signal will be described. The difference (ΔE/R) in the etching rate between the case where N$_2$ gas is not added to HF gas and the case where N$_2$ gas is added to HF gas depends on the power of the second RF signal. When the difference in the etching rates and the power of the second RF signal are plotted on a graph, and two points at "0 kW" and "7 kW" are extrapolated, the graph illustrates a straight line connecting "−800" and "200" of the difference (ΔE/R) in the etching rate. The unit of the difference (ΔE/R) in the etching rate is [nm/min]. In the graph, when the difference in the difference of the etching rate exceeds "0," the power of the second RF signal is approximately 6 kW, and when standardized, it is approximately 8.49 W/cm$^2$. That is, when the power of the second RF signal is 6 kW or more, the addition of N$_2$ gas has the effect of increasing the etching rate as compared with the case where N$_2$ gas is not added. Further, when the power of the ions exceeds approximately 8.49 W/cm$^2$, the nitrided area is removed and the etching is proceeded in the bottom.

Next, temperature dependence when N$_2$ gas is added to H$_2$/CF$_4$ gas will be described. In each experimental result when the temperature is changed, the substrate W before etching is −70° C., −40° C., and 20° C., and the processing gas is H$_2$/CF$_4$ gas and H$_2$/CF$_4$/N$_2$ gas, and the etching is performed on the silicon oxide film and the silicon nitride film under the following processing conditions. Further, in the processing conditions, "CW" in the power of the RF signal represents a continuous wave.

Figure 10:
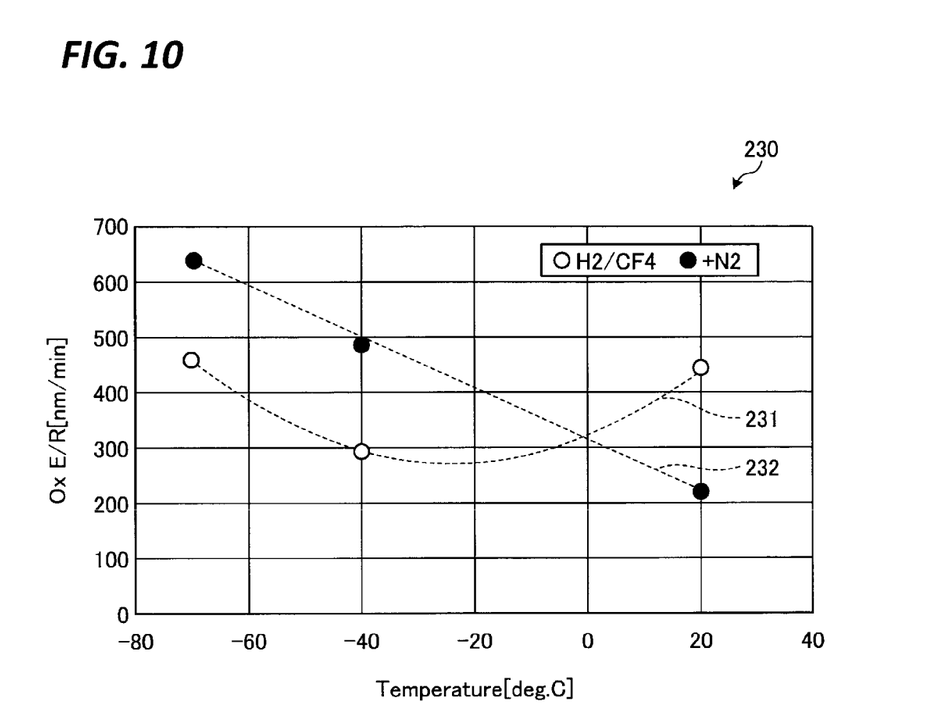
FIG. 10 is a graph illustrating temperature dependence in the experimental results.

[Processing Conditions]
(Etching)
Pressure in the reaction chamber 10: 25 mTorr (3.333 Pa)
Power of the first RF signal (40 MHz): 4.4 kW (CW)
Power of the second RF signal (400 kHz): 7.0 kW (CW)
Processing time: 30 seconds
Temperature: −70° C., −40° C., and 20° C.
Processing gas: H$_2$/CF$_4$/N$_2$=150/50/0 sccm
: H$_2$/CF$_4$/N$_2$=150/50/20 sccm FIG. 10 is a graph illustrating temperature dependence in the experimental results. A graph 230 illustrated in FIG. 10 is a graph of the etching rate with respect to the silicon oxide film among the experimental results. A graph 231 represents the temperature dependence of the etching rate in the case of H$_2$/CF$_4$ gas. A graph 232 represents the temperature dependence of the etching rate in the case of H$_2$/CF$_4$/N$_2$ gas. The temperature dependence of the etching rate between the case of H$_2$/CF$_4$ gas illustrated in the graph 231 and the case of H$_2$/CF$_4$/N$_2$ gas illustrated in the graph 232 is compared with each other. The unit of the etching rate is [nm/min]. In the case of H$_2$/CF$_4$ gas, the etching rate is "460" at −70° C., "294" at −40° C., and "444" at 20° C. Meanwhile, in the case of H$_2$/CF$_4$/N$_2$ gas, the etching rate is "642" at −70° C., "488" at −40° C., and "222" at 20° C. That is, the etching rate of H$_2$/CF$_4$/N$_2$ gas is higher than that of H$_2$/CF$_4$ gas from −70° C. through −40° C. to around 0° C. Meanwhile, on the contrary, the etching rate of H$_2$/CF$_4$ gas is higher than that of H$_2$/CF$_4$/N$_2$ gas from around 0° C. to 20° C. That is, it may be seen that the effect on the improvement of the etching rate by adding N$_2$, is activated in the low temperature region. Meanwhile, it may be seen that the effect is reversed at room temperature.

Next, among the experimental results, focusing on the silicon nitride film, the temperature dependence of the etching rate between the case of H$_2$/CF$_4$ gas and the case of H$_2$/CF$_4$/N$_2$ gas is compared with each other. The unit of the etching rate is [nm/min]. In the case of H$_2$/CF$_4$ gas, the etching rate is "2,104" at −70° C., "2,350" at −40° C., and "1,790" at 20° C. Meanwhile, in the case of H$_2$/CF$_4$/N$_2$ gas, the etching rate is "1,920" at −70° C., "96" at −40° C., and "714" at 20° C. That is, under the conditions of −40° C. and H$_2$/CF$_4$/N$_2$ gas, the etching rate of the silicon nitride film is "96," and is lower than "488," which is the etching rate of the silicon oxide film. From the above, it may be seen that the conditions of −40° C. and H$_2$/CF$_4$/N$_2$ gas may be applied to a self-aligned contact (SAC) process. That is, under the above conditions, in the SAC process with respect to the multilayer film in which the silicon nitride film (SiN) and the silicon oxide film (SiO$_2$) are laminated, the silicon oxide film (SiO$_2$) may be selectively etched. When applied to the SAC process, the temperature condition may be in a range of −50° C. to −30° C., and more desirably −40° C.

In the above embodiment, the plasma processing system 1 includes a plasma processing apparatus 1a, which is an example of an etching apparatus that etches a silicon oxide film, and the controller 1b, but may be an etching apparatus that etches a silicon oxide film in a form including the plasma processing apparatus 1a and the controller 1b.

In the above, according to the embodiment, the etching apparatus (plasma processing system 1) that etches a silicon oxide film includes the reaction chamber, the stage (support 11), the plasma generating unit, and the controller 1b. The controller 1b is configured to control the apparatus such that the substrate W including the etching film including the silicon oxide film 102, and the mask 103 formed on the etching film is provided on the stage. The controller is configured to control the apparatus so as to set the temperature of the stage to be 0° C. or less. The controller 1b is configured to control the apparatus so as to generate plasma from a gas containing fluorine, nitrogen, and carbon, and having a ratio of the number of fluorine to the number of nitrogen (F/N) in a range of 0.5 to 10 to etch the silicon oxide film 102 through the mask 103. As a result, it is possible to improve the etching rate while suppressing the expansion of the CD.

Further, according to the embodiment, the mask 103 is a carbon-containing mask. As a result, it is possible to supply carbon to the plasma in the etching using $HF/N_2$ gas.

Further, according to the embodiment, the gas further contains a hydrogen-containing gas. As a result, it is possible to improve the etching rate in a low temperature environment.

Further, according to the embodiment, the gas contains a carbon-containing gas. As a result, it is possible to use the mask 103 that does not contain carbon.

Further, according to the embodiment, the gas contains an HF gas and-$N_2$-containing gas. As a result, it is possible to improve the etching rate while suppressing the expansion of the CD.

Further, according to the embodiment, the temperature of the substrate W (temperature of the stage) before the etching is set to be −30° C. or less. As a result, it is possible to further improve the etching rate.

Further, according to the embodiment, the etching film is a laminated film further including a silicon nitride film. As a result, it is possible to improve the etching rate for the laminated film.

Further, according to the embodiment, the gas contains a cyanide-containing gas. As a result, it is possible to further improve the etching rate.

Further, according to the embodiment, the silicon oxide film 102 is etched such that the final aspect ratio is 5 or more. As a result, in a deep hole drilling, it is possible to improve the etching rate while suppressing the expansion of the CD.

In the above embodiment, $HF/N_2$ gas that is a fluorine-and-nitrogen-containing gas is used as a processing gas, but the present disclosure is not limited thereto. For example, except for $NF_3$ gas, various gases such as $H_2/CF_4/N_2$ gas used in a part of the experimental results, or a gas containing cyanide (CN group) such as HCN, CNF, and $C_2N_2$ may be used. Further, for example, depending on the material of the etching film or the mask, a silicon-and-fluorine-containing gas, or a metal element (Ti and W)-and-chlorine-containing gas may be used.

Further, in the above embodiment, the plasma processing apparatus 1a that performs a processing such as the etching on the substrate W using a capacitively coupled plasma as a plasma source has been described as an example, but the disclosed technology is not limited thereto. As long as the apparatus performs a processing on the substrate W using plasma, the plasma source is not limited to the capacitively coupled plasma, and. for example, any plasma sources such as inductively coupled plasma, microwave plasma, or a magnetron plasma may be used.

According to the present disclosure, it is possible to improve the etching rate while suppressing the expansion of the CD.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. An etching method comprising:
    providing, on a stage, a substrate including an etching film containing a silicon oxide film, and a carbon-containing mask on the etching film;
    setting a temperature of the stage to be 0° C. or less; and
    generating plasma from a hydrogen fluoride gas and a nitrogen gas, wherein a nitrogen gas flow rate is 5% to 50% of a total flow rate of the hydrogen fluoride gas and the nitrogen gas; and
    etching, using the generated plasma, the silicon oxide film through the carbon-containing mask.

2. The etching method according to claim 1, wherein the gas contains a carbon-containing gas.

3. The etching method according to claim 2, wherein the gas contains a cyanide-containing gas.

4. The etching method according to claim 3, wherein the etching is performed such that a final aspect ratio of the silicon oxide film is 5 or more.

5. The etching method according to claim 1, wherein the nitrogen gas is a $N_2$-containing gas.

6. The etching method according to claim 5, wherein, in the setting, the temperature of the substrate is set to be −30° C. or less.

7. The etching method according to claim 6, wherein the etching film is a laminated film further including a silicon nitride film.

8. The etching method according to claim 1, wherein, in the setting, the temperature of the substrate is set to be greater than or equal to −70° C. and less than −30° C.

9. The etching method according to claim 1, wherein the etching film is a laminated film further including a silicon nitride film.

10. The etching method of claim 9, wherein the nitrogen gas flow rate is 5% to 25% of the total flow rate of the hydrogen fluoride gas and the nitrogen gas.

11. The etching method according to claim 1, wherein the gas contains a cyanide-containing gas.

12. The etching method according to claim 1, wherein the gas further contains carbon.

13. The etching method according to claim 1, wherein the etching is performed such that a final aspect ratio of the silicon oxide film is 5 or more.

14. The etching method of claim 13, wherein the generating the plasma step and the etching step are repeated until the final aspect ratio of the silicon oxide film is 5 or more.

15. The etching method of claim 14,
    wherein during the etching, a hole is formed in the silicon oxide film, and
    wherein during the repeating of the etching, CN radicals are adsorbed on a bottom of the hole and side surfaces of the hole, and the CN radicals are removed from the bottom of the hole, thereby etching the bottom of hole, while remaining on the side surfaces of the hole.

16. The etching method of claim 1, wherein the etching film includes an etched hole and wherein CN radicals are adsorbed on a bottom of the hole.

17. The etching method of claim 16, wherein the CN radicals are generated from a CN based gas contained in the generated plasma as a reactive species, the CN based gas including at least one of hydrogen cyanide (HCN), cyanogen fluoride (CNF), and bisisocyanide ($C_2N_2$).

18. An apparatus for etching a silicon oxide film comprising:
   a reaction chamber;
   a stage provided in the reaction chamber;
   a plasma generator configured to generate plasma in the reaction chamber; and
   a controller,
   wherein the controller executes an etching method including:
   providing, on a stage, a substrate including an etching film including a silicon oxide film, and a carbon-containing mask formed on the etching film,
   setting a temperature of the stage to be 0° C. or less, and
   generating plasma from a hydrogen fluoride gas and a nitrogen gas, wherein a nitrogen gas flow rate is 5% to 50% of a total flow rate of the hydrogen fluoride gas and the nitrogen gas, thereby etching the silicon oxide film through the mask using the generated plasma.

19. The apparatus according to claim 18, wherein the gas further contains carbon.

* * * * *